United States Patent [19]
Fisher et al.

[11] 3,956,717
[45] May 11, 1976

[54] HYBRID DIPLEXING FILTER

[75] Inventors: Robert A. Fisher; Alexander W. Gillespie; Edward D. McCormick, all of Chaska, Minn.

[73] Assignee: Wideband Services, Inc., Chaska, Minn.

[22] Filed: Aug. 1, 1974

[21] Appl. No.: 493,527

[52] U.S. Cl. ............................. 333/11; 333/70 R; 333/77; 333/78
[51] Int. Cl.² ..................... H03H 7/08; H03H 7/14; H03H 7/46; H04R 3/50
[58] Field of Search ............ 333/1, 6, 10, 11, 73 R, 333/70 R, 77, 78; 328/167; 179/170 R, 170 J, 170 HF, 170 D

[56] References Cited
UNITED STATES PATENTS
3,775,703  11/1973  Smith .................................. 333/11

*Primary Examiner*—Alfred E. Smith
*Assistant Examiner*—Marvin Nussbaum
*Attorney, Agent, or Firm*—Merchant, Gould, Smith, Edell, Welter & Schmidt

[57] ABSTRACT

A hybrid diplexing filter for use in CATV systems and the like, having a pair of high pass filters and a pair of low pass filters connected in an electrical bridge circuit with a common port, a high pass port and a low pass port connected at appropriate nodes. Impedance compensation means is included within the high pass filter which connects between the common port and the high pass port, for compensating the diplexing filter for the effects of unwanted stray capacitances. In a preferred embodiment, impedance compensation is accomplished by a phase inversion transformer having a predetermined amount of leakage inductance. A power passing port, power blocking means and rf isolation means are also connected to the bridge circuit so that 60 cycle power may be passed from the common port through the filter to the power passing port without upsetting the signal handling properties of the hybrid diplexing filter. A preferred physical realization of the subject circuit is also disclosed.

13 Claims, 4 Drawing Figures

HYBRID DIPLEXING FILTER

BACKGROUND OF THE INVENTION

In the field of cable communication transmission systems, it is often necessary to transmit over a coaxial cable multiple signals, separated from one another in different frequency bands. In many such systems, it is desirable to transmit signals simultaneously in both directions along the cable, the signals travelling in opposite directions being separated from each other through the use of two separate frequency bands. An example of such a system is found in the CATV field, wherein signals carrying a great number of complete television and FM programs may be transmitted either way on a single cable. For example, in one common type of system, one band of frequencies ranging generally from 5 MHz to 35 MHz and called the sub-frequency may be travelling in one direction on the cable, while another band of frequences ranging generally from 50 to 300 MHz, called the VHF band, may be travelling in the other direction.

Because of attenuation losses in the cable, it is necessary to provide amplifiers at intervals along the transmission line. It is known in the art to provide diplexing filters at each amplification station along the line, so that each band of frequencies may be separated from the composite signal on the line, amplified, then re-introduced to the line with another diplexing filter.

Prior art diplexing filters comprise separate high and low pass filters both coupled to the transmission line, with each filter providing an approximate impedance match to the line over its own range of frequencies. One problem which exists with these prior art diplexing filters is that they do not provide an impedance match for the transmission line for frequencies near the crossover between the high and low pass filters. Thus, any power having a frequency near the crossover frequency of the system which is inadvertently introduced into the transmission line is not absorbed, but is reflected back and forth along the line, thereby creating undesired effects. Even though the communication transmission system is carefully designed so that the upper and lower frequency bands are spaced from the crossover point, in practice undesired frequencies near the crossover are still introduced due to harmonics and sub-harmonics generated by nonlinear devices present in the system, and by noise and electromagnetic interference picked up by the system.

There exists in the prior art one class of diplexing filter which theoretically could solve the above-mentioned problems by providing a constant input impedance at all frequencies. This class of filters is generally called hybrid diplexing filters. Unfortunately, despite their theoretic advantages, hybrid diplexing filters have not achieved practical commercial usage, to the best of our knowledge, because certain problems involved in making a practical physical realization of the theoretic circuit have not heretofore been successfully overcome.

Hybrid diplexing filters generally comprise more or less symmetrical bridge circuits made up of a pair of high pass filters and a pair of low pass filters, with a common port and low and high pass ports connected at appropriate nodes in the bridge. The common port is generally connected to the transmission line, so that signals inthe higher frequency band are coupled from the transmission line to the high pass port, in either direction. Similarly, signals in the lower frequency band are coupled from the transmission in the to the low pass port in either direction. Signals can therefore be split off from the composite signal on the line, for purposes of amplification, and after amplification they can be re-introduced to the line using another such filter.

In designing hybrid diplexing filters, the value of the components in the high and low pass filters are calculated to provide a crossover point between the two bands of frequencies of interest in a given system. A main purpose of these diplexing filters is to maintain a constant input impedance at the common port while providing a high degree of isolation between the low pass and high pass ports over the entire range of frequencies to be transmitted. In order to obtain useful efficiency, this input impedance must match very closely the driving point characteristic impedance, e.g. the transmission line being used, or else reflections will occur between the transmission line and the diplexing filter, leading to excessive degradation and signal losses in the system. A measure of the efficiency of energy transfer between the cable and the filter is the return loss, which is directly dependent upon the input impedance of the filter. Ideally, this return loss should be as low as possible, preferably less than −20 db to −30 db.

The mathematical theories of design of hybrid diplex filters are known in the art as set forth, for example, in U.S. Pat. No. 3,593,209, issued to N. C. Gittinger. However, practical devices in the prior art constructed according to these principles have failed to provide good performance; especially at the higher frequencies. Specifically, prior art devices have exhibited excessively large return loss which makes them unusable or only marginally usable in a practical CATV system. These prior art hybrid diplexing filters exhibit a fall-off of impedance at the higher frequencies which accounts for the poor return loss. For example, in systems designed for 75 ohm cables, typical prior art diplex filters may have a return loss of better than −20 db below 100 MHz, but this figure will fall to approximately −20 db by 150 MHz, and may be down to only −14 db at 300 MHz. This characteristic not only results in a significant loss of signal due to impedance mismatching, but also can lead to severe "ghosting" of the video signals being transmitted. These last-mentioned effects are particularly detrimental to the signals carrying color information in a television signal.

The main reason for this poor performance of prior art hybrid diplexing filters is stray capacitance which is associated with any physical realization of a circuit. Sources of stray capacitance include the coaxial connectors, adjacent conductor paths on a circuit board, and capacitive effects between windings in a coil, or between adjacent coils. Standard techniques of physical circuit layout to minimize capacitances have proved to be ineffective in dealing with this problem, in part, because of the high frequencies involved.

One prior art technique for attempting to compensate for some of this stray capacitance involves placing an additional inductance, called a peaking coil, in series between the common port and the bridge circuit and/or in series with the first high pass filter section. This technique helps to compensate for the capacitance by boosting the input impedance over a range of high frequencies. While this method has met with limited success, it suffers from the drawback of requiring additional components, thereby incurring additional assembly costs, and also may involve production problems in maintaining uniformity of performance between production units. This is because the peaking coils are of very low inductance, perhaps only one-quarter of a turn of wire, so that slight non-uniformities in assembly may have a pronounced percentage change on the effect of the peaking coil.

It is also desirable to provide power for operating the amplifiers along the line through the transmission line itself. This would involve placing 60 cycle AC power on the transmission line in addition to the upper and lower signal bands. The object is then to provide means at each amplification station for taking the 60 cycle power from the transmission line, rectifying it and using the resulting DC potential for powering the amplifiers. One problem which must be overcome before such a scheme can be useful in a practical system is the problem of isolation of the signal circuits, particularly the lower signal frequency circuits from the power circuits, and vice-versa. One alternative is to connect an rf stop band filter circuit to the common port. However, because the rf filter must pass a rather large amount of power, this leads to a coil for the rf filter which has a significant amount of interwinding capacitance, and this capacitance can in itself load down the common port, degrading the impedance match at high frequencies.

The present invention provides means for compensating for unwanted stray caapacitances associated with a physically realizable circuit, and also provides means for receiving low frequency power from the transmission line, without upsetting the high frequency signal handling properties of the filter.

According to one aspect of the present invention, the necessary impedance compensation for stray capacitances is accomplished by including impedance compensation means within the high pass filter which connects the common port to the high pass port. The physical layout of the circuit is carefully controlled so that the stray capacitances associated therewith are held to a reasonably small value. The impedance compensation means is then selected to provide the necessary compensation to compensate for the remaining stray capacitance. In a preferred embodiment, this impedance compensation is provided by including a transformer in this high pass filter. The transformer performs a dual function. One function is known in the prior art, and this function is to provide phase inversion so as to provide power isolation between the low and high pass ports which are opposite each other across the bridge. This is necessary to prevent unwanted oscillations which might occur in a system including amplifiers if the loop gain through the amplifiers and diplexing filters became greater than one at a given frequency. Although this particular function of the transformer is known in the prior art, prior art circuits placed the phase inverting transformer in a leg away from the common and high pass ports.

The second function of the transformer according to a preferred embodiment of the invention is to provide a carefully predetermined amount of leakage inductance in this high pass filter. This leakage inductance will then compensate for the effects of the unwanted stray capacitance. This use of the transformer is not found in prior art hybrid diplexing filters.

According to another aspect of the present invention, one way to control the leakage inductance of the transformer is to use a modified bifilar winding technique.

The primary and secondary conductors are first twisted together, then wound on a core to form the transformer. The degree of twisting determines the amount of leakage inductance.

According to yet another aspect of the present invention, means are provided for taking low frequency power from the hybrid filter for line powering the amplifiers without upsetting the carefully balanced high frequency performance of the circuit.

According to a preferred embodiment, this is accomplished by passing the low frequency power through at least a part of the low pass filter which communicates between the common port and the low pass port. The coils in at least a part of this low pass filter are wound with sufficiently thick wire so that the low pass filter can pass both the lower band of rf signals, and the low frequency power. Power blocking means associated with the low pass port provides isolation of the low pass port from the low frequency power, and rf signal isolation means associated with the power passing port isolates the power passing ports from rf signals.

SUMMARY OF THE INVENTION

According to the present invention, there is provided a hybrid diplexing filter which has a common port, a high pass port and a low pass port. A first high frequency filter is connected for passing high frequency signals between the common port and the high pass port. A first low frequency filter is connected for passing signals having a frequency lower than the high frequency signals, between the common port and the low pass port. A second high frequency filter and a second low frequency filter are connected respectively to a first high frequency filter and the first low frequency filter, and to each other to complete a bridge circuit. The first high frequency filter includes impedance compensation means for compensating the hybrid diplexing filter for the effect of stray capacitances associated therewith.

In a preferred embodiment, the impedance compensation means comprises a phase inversion transformer having a predetermined leakage inductance.

According to yet another aspect of the present invention, the transformer may be a modified bifilar wound transformer in which the primary and secondary conductors are twisted together to a predetermined extent, so as to provide the predetermined leakage inductance.

According to yet another aspect of the present invention, low frequency power handling capability for the hybrid diplexing filter is provided by power blocking means associated with the low pass port, and rf signal isolation means connecting a power passing port to the first low pass filter.

According to a further aspect of the present invention, a preferred physical realization of the filter, having superior power isolation characteristics is provided.

DESCRIPTION OF THE PREFERRED EMBODIMENTS

Figure 1:
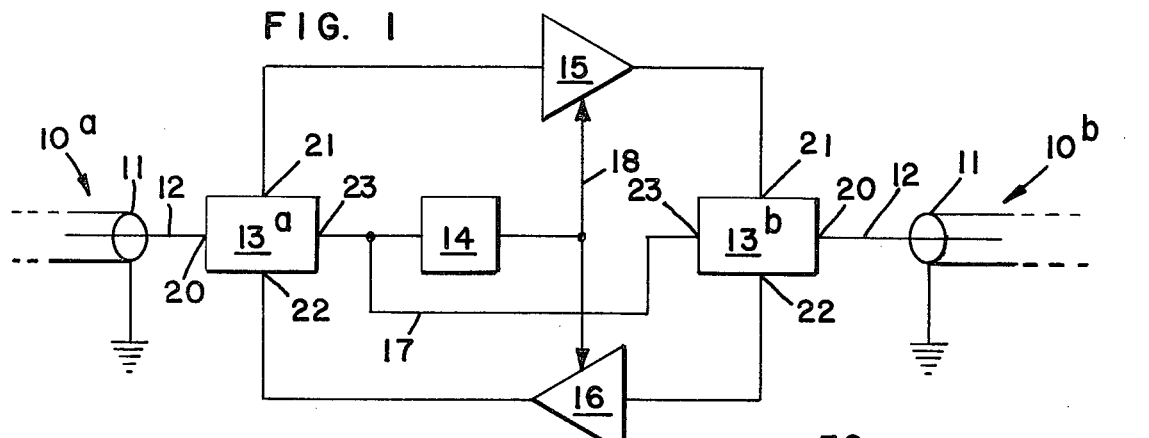
FIG. 1 is a block diagram illustrating the use of hybrid diplexing filters according to the present invention.

By way of background, FIG. 1 illustrates the application of a pair of hybrid diplexing filters according to the present invention, to a typical CATV transmission line amplification station. In FIG. 1, a coaxial cable 10 is separated to allow insertion of the components which make up the amplification station. Reference numeral 10a refers to the portion of the line on the left side of the drawing, and reference numeral 10b refers to the continuation of the line on the right side of the drawing. The transmission line 10 comprises an outer shield 11, which is grounded, and an inner conductor 12 which carries the composite signal.

The amplification station comprises a pair of hybrid diplexing filters 13a and 13b, a power supply 14, and high and low frequency power amplifiers 15 and 16. Each of the hybrid diplexing filters has a common port 20, a high pass port 21, a low pass port 22, and a power passing port 23. For purposes of illustration, assume that the high frequency band of signals and the AC power are being transmitted from left to right, that is, from transmission line 10a to 10b, and the low frequency signal band is being transmitted in the opposite direction, from transmission line 10b to 10a. Sixty-cycle power from transmission line 10a is delivered to port 23 by the action of the hybrid diplexing filter 13a. Power is then applied to power supply 14, which provides the necessary working voltage at lead 18, for operation of amplifiers 15 and 16. The AC from power passing port 23 of diplex filter 13a is also connected by lead 17 to the power passing port of diplex filter 13b, where it is coupled on into transmission line 10b.

The high frequency band of signals from transmission line 10a are delivered via high pass port 21 to the input of amplifier 15. These signals are then amplified and introduced to the high pass port 21 of diplex filter 13b, which couples them onto transmission line 10b. In similar manner, the low frequency band of signals from transmission line 10b are coupled to the low pass port 22 of diplex filter 13b, and then to the input of low frequency amplifier 16. These signals are then amplified and connected to low pass port 22 of diplexing filter 13a, which couples them onto transmission line 10a for continuation of propagation towards the left in FIG. 1.

Thus, the two bands of frequencies each travelling in opposite directions, are removed from the transmission line, amplified, and re-introduced in the proper direction. Power for operating the amplifiers is taken from the transmission line, then re-introduced on the next section of transmission line for powering subsequent amplification stations.

It will be appreciated that in order to avoid signal degradation and to achieve a good return loss figure, the input impedance at the common port 20 of hybrid diplexing filters 13 must closely match the characteristic impedance of transmission line 10, and must remain uniform over the range of all signal frequencies in the system. Further, the impedance at the high pass port 21 and the low pass port 22 should also be constant. Finally, the diplexing filter 13 must provide a high degree of power isolation between the high pass port 21 and low pass port 22 in order to avoid oscillations. For example, consider the signal loop from the output of amplifier 15, through diplex filter 13b from port 21 to port 22, through amplifier 16, through diplex filter 13a from port 22 to port 21, and back to the input of amplifier 15. If enough power is transmitted through the diplexing filters from high pass port to low pass port and vice-versa, so as to cause the loop gain to exceed one at some frequency, tthe system would break into oscillation. The same consideration applies with respect to the gain of low frequency signals from amplifier 16 passing through the same loop. In order to avoid oscillations, the gain of amplifiers 15 and 16 must be limited to keep the loop gain below one. Thus, the power isolation characteristics of the hybrid diplexing filters present a limit as to the maximum signal gain which may be used; if greater power isolation is available, higher gain amplifiers may be employed. Of course, if the gain of the amplifiers must be reduced, this means that amplification stations must be provided at closer intervals, thus increasing the number of stations and greatly increasing the cost of an information system of a given length. Thus the power isolation system of the diplexing filter is an important factor in the commercial feasibility of the entire system.

Figure 2:
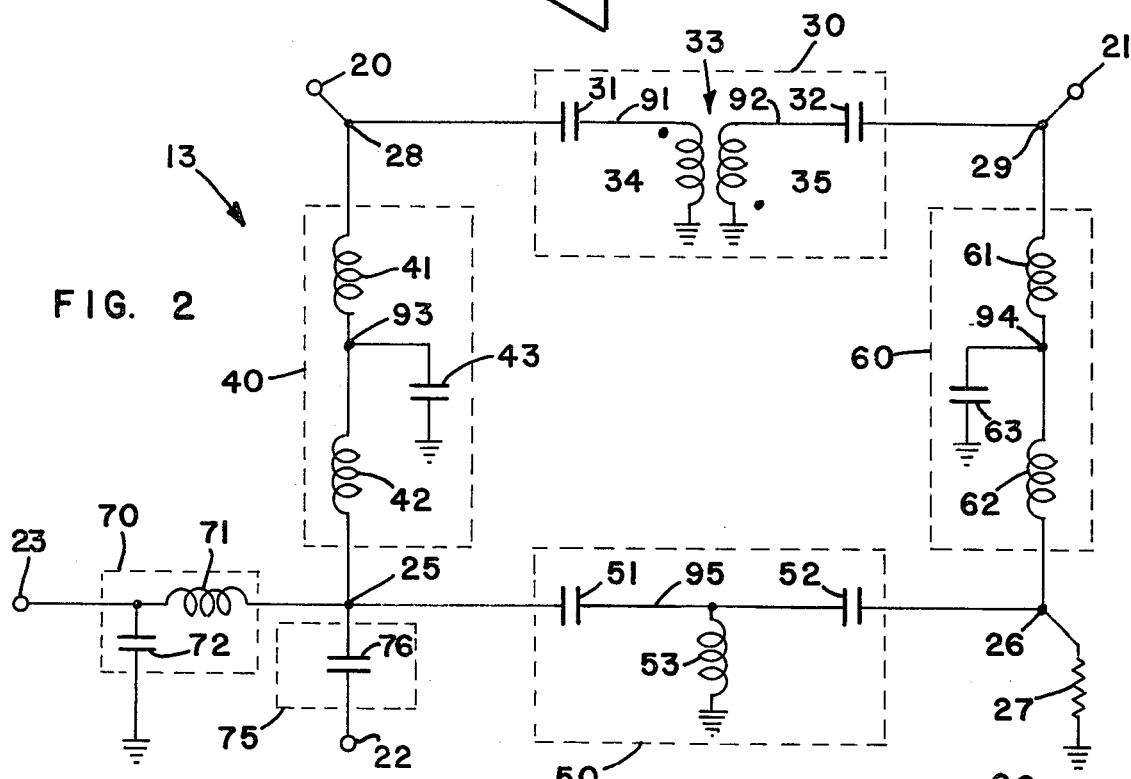
FIG. 2 is an electrical schematic diagram of the hybrid diplexing filter of the present invention.

In FIG. 2, the schematic diagram of the hybrid diplexing filter 13 is shown. Reference numeral 20 designates the common port, reference numeral 21 designates the high pass port, number 22 designates the low pass port, and reference number 23 designates the power passing port. A high pass filter 30 connects from common port 20 to high pass port 21. A low pass port 40 connects from common port 20 to a circuit node, or lead 25. Another high pass filter 50 connects from lead 25 to a lead 26. Finally, another low pass filter 60 connects from the high pass port 21 to lead 26, to complete the bridge circuit. Because the circuit shown in FIG. 2 includes the line powering capability, the low pass port 22 is separated from lead 25 by an additional circuit element. If the line powering capability were not included, the lead 25 could connect directly to the low pass port.

Node 26 is directly opposite the common port 20 in the bridge circuit just described. Since connections are not ordinarily required at this point, no external port is provided. For this reason, node 26 is sometimes referred to as the buried port. In normal operation, the common port 20 and high and low pass ports 21 and 22 are all terminated in the characteristic impedance of the system, through the transmission line and amplifiers respectively. The balanced symmetry of the hybrid filter implies that the buried port 26 should be similarly terminated, and a resistor 27 having a value equal to the characteristic impedance of the system is connected from node 26 to ground for that purpose.

Since the circuit shown in FIG. 2 does have line powering capability, a power passing part 23 is provided. RF signal isolation means 70 is provided between node 25 and power passing port 23. The rf isolation means comprises an inductor 71 and a capacitor 72 which connects from the power passing port to signal ground. Power blocking means 75 is provided between node 25 and the low pass port 22. In the preferred embodiment, the power blocking means comprises a capacitor 76.

Low pass filter 40 is a T-filter having series connected coils 41 and 42. Coil 41 connects to node 28 which, in turn, connects to the common port 20. The other end of coil 42 connects to node 25. A capacitor 43 connects from the junction of coils 41 and 42 to signal ground.

Low pass filter 60 is identical to low pass filter 40. It comprises a coil 61 which connects to node 29, which in turn connects to high pass port 21. The second coil, number 62, connects between coil 61 and node 26. Capacitor 63 connects between signal ground and the junction of coils 61 and 62.

High pass filter 50 is also a T-filter, comprising capacitors 51 and 52, and coil 53. Capacitors 51 and 52 connect in series between nodes 25 and 26, and coil 53 connects from the junction of capacitors 51 and 52 to signal ground.

High pass filter 30, which connects between the common port and the high pass port, is very similar to pass port 50, but differs in having a transformer 33 instead of the single coil 53 as in filter 50. Transformer 33 has a primary winding 34, and a secondary winding 35. One lead of the primary and one lead of the secondary are connected to signal ground. The other lead of primary 34 connects through capacitor 31 to node 28, which in turn connects to the common port 30. The other lead of secondary 35 connects through capacitor 32 to node 29, which is connected to the high pass port 21. Transformer 33 is connected into the circuit so as to provide a phase inversion, as indicated by the dots in the drawing. Transformer 33 has a unity turns ratio, and a high coupling coefficient. It will be appreciated that the terms "primary" and "secondary" as applied to windings 34 and 35 is somewhat arbitrary, because in use high frequency signals may pass either way between common port 20 and high pass port 21.

The values of the capacitors and inductors used in the circuit are selected in accordance with known design formulas in view of the desired crossover frequency between the lower and higher frequency bands. For example, general design equations are set forth in U.S. Pat. No. 3,593,209, previously mentioned. Inductor 71 and capacitor 72 are chosen so as to block all radio frequency signals involved, while passing the low frequency power. Capacitor 76 is selected to block low frequency power from the low pass port 22, but to pass all rf signals applied thereto.

Once the proper component values are selected to give filter sections 30, 40, 50 and 60 the desired characteristics, the hybrid diplexing filter will function as follows. High frequency signals will be coupled between common port 20 and high pass port 21 by high pass filter 30. Signals lying in the lower band of frequencies will be coupled between common port 20 and low pass port 22 by low pass filter 40, but will be blocked by high pass filter 30. Since the total bridge circuit is nearly symmetrical, the input impedance at each of the four corners remains constant, which is a unique function of the hybrid diplexing filter. Transformer 33 provides the dual function of phase inversion and impedance compensation. Signals passing from node 25 towards node 29 through the two alternate paths will each undergo the same attenuation; that is, each path involves a high pass filter and a low pass filter of identical properties. However, the signal passing through the upper path undergoes a phase inversion as well. The signals from the two paths are therefore of equal amplitude but opposite phase and they cancel, thus providing power isolation between the high and low pass ports. The second function performed by transformer 33 is to compensate for stray capacitances associated with the circuit, which has been previously discussed.

It is a known fact that any physical realization of an electronic circuit necessarily involves capacitances, inductances, and conductances which are inherent in the components and the physical layout of the components used in the circuit, but which are generally not accounted for in mathematical models of the circuit. For example, any physical realization of the circuit shown in FIG. 2 will have unwanted stray capacitances associated therewith. Such capacitances result from the coaxial connectors used for the ports, from the size and spacing of conductor pads on a circuit board in relation to the circuit ground, and in interwinding capacitances of coils, among other causes. At high frequencies approaching 300 MHz used in CATV systems, the reactance of these stray capacitances can become appreciable, and if they are not carefully controlled, they can result in an impedance mismatch at the higher frequencies. It is this problem which has heretofore prevented hybrid diplexing filters from being used in practical systems.

We have discovered that these unwanted stray capacitances can be successfully controlled, thereby yielding a practical filter which is relatively easy to manufacture, and which has high performance over the entire frequency range. If the physical layout of the circuit is carefully controlled, as explained hereinafter, in order to minimize the stray capacitances associated with the circuit, then impedance compensation means can be included within the high pass filter 30 in order to compensate the circuit for the effect or the remaining stray capacitances.

In the preferred embodiment, impedance compensation is accomplished by transformer 33. This transformer is designed to have a predetermined small amount of leakage inductance. This is accomplished by making its coupling coefficient a predetermined small percentage less than unity. The exact amount of leakage inductance required must be determined experimentally for a given circuit layout. However, once the proper amount is determined, the effect of the transformer is repeatable, and the circuits can then easily be made on a production basis.

According to a well-known high frequency mathematical model of a closely coupled transformer, the leakage representing the less than perfect coupling appears as a series connected leakage inductance. This leakage inductance is used to compensate for the unwanted stray capacitances. According to the preferred embodiment, the transformer having the controlled leakage inductance is constructed with a modified bifilar winding technique.

Figure 3:
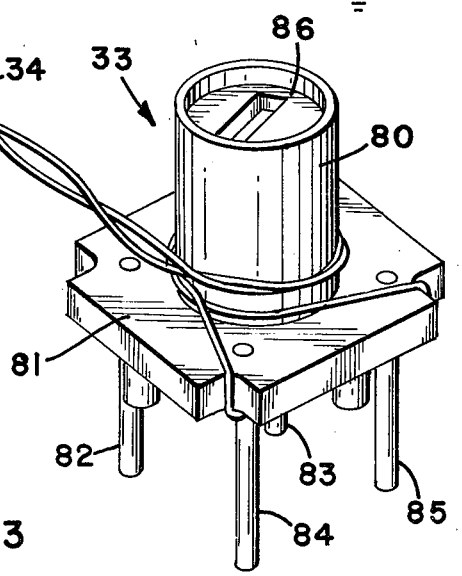
FIG. 3 is a perspective view illustrating the preferred construction of the transformer used in the circuit of FIG. 2.

In FIG. 3, reference numeral 33 generally designates the transformer for use in the circuit of FIG. 2. The transformer is wound on a form having an upper cylindrical portion 80 and a base 81. Pins 82–85 located near the corners of the base are useful for mounting the transformer to a circuit board, and for making electrical connections to the primary and secondary. An adjustable high frequency powdered iron core 86 is positioned within the upper portion of the form 80 for tuning. The windings comprise a pair of wires 34 and 35. In a bifilar winding, the two wires are held together than wound around the core. In the modified bifilar winding according to the present invention, the two wires 34 and 35 are twisted together to a predetermined extent before winding on the form. The leakage inductance is controlled by controlling the number of twists per unit length which are applied to wires 34 and 35.

One end each of wires 34 and 35 are connected to pins 84 and 85. After winding around the core, the other ends will be connected to the other pins 82 and 83, although in FIG. 3 the other ends are shown partly unwound, so as to illustrate the twisting of the two conductors. Because the turns ratio must remain one to one, the total path length of the two wires 34 and 35 must be as nearly equal as possible. Thus, if wire 34 is connected at one end to pin 85, it should be connected at the other end to pin 82, which is diagonally opposed therefrom, in order that the lengths of the two wires will be equal. Likewise, the other wire 35 should begin and end on diagonally opposed pins. It will be appreciated that although transformer 33 has been called a "phase inversion transformer", having a primary 34 and secondary 35, in fact these terms refer to the manner in which the transformer is connected into the circuit, rather than imposing physical limitations on the transformer itself. Thus, either of the two wires could be considered the primary or secondary, and the phase inversion characteristic follows from the manner in which the two wires are connected into the circuit.

Referring again to FIG. 2, it will be appreciated that unwanted stray capacitances at nodes 28 or 29 are potentially more damaging to the operation of the filter than capacitances at other nodes, because nodes 28 and 29 are more directly involved in the transmission of high frequency signals. Placing the impedance compensation means which comprises the controlled leakage conductance transformer 33 in the high pass leg between these nodes provides a means for compensating for stray capacitances at those nodes. In order to further minimize capacitance at node 28, which connects to the common port, the low frequency power handling circuitry is isolated therefrom by at least a portion of the low pass filter leg 40. Since inductor 71 used in the rf filter means 70 can have an appreciable amount of interwinding capacitance, it should not be connected directly to the common port. It is preferably connected to node 25, as shown in FIG. 2, or alternatively to node 93 which is in the center of the low frequency filter 40.

With the power passing port thus isolated from the common port, the inductors 41 and 42 must be capable of carrying the relatively high currents required for the power supply which operates the amplifiers. Thus it is necessary to wind coils 41 and 42 from a much heavier gauge of wire than is ordinarily used for high frequency work. It is advantageous to wind all coils used in the hybrid filter (except transformer 33) from the same wire, even though other coils will not carry the high currents, because this helps maintain the performance of the filter by keeping the filter sections in opposite legs of the bridge as nearly identical as possible.

In order to construct a successful physical embodiment of a hybrid diplexing filter, stray capacitances must be controlled in order to provide a good impedance match over the entire frequency range, and electrical symmetry must be maintained in order to provide good power isolation. Electrical symmetry means that the electrical characteristics of low pass filter sections 40 and 60 must be identical, and the electrical characteristics of high pass sections 30 and 50 must be nearly identical, except for the phase inversion, and for the intentional leakage inductance which is used to compensate for unwanted capacitances.

In laying out the circuit on a circuit board, it is important to use high Q coils. The requirement of electrical symmetry implies a high degree of physical symmetry. Thus, the length of the corresponding nodes on the circuit board should be made equal, as nearly as possible. Slight adjustments from the calculated values can then be made in the capacitors in order to make up for differences in path lengths. In order to control and minimize the stray capacitance, the circuit board conductors representing the four corner nodes of the bridge must be kept as physically small as possible. If it is necessary to run a connection to or from a port for a very great distance, a coaxial cable, or in the alternative, circuit board stripline technology should be used to keep from adding additional capacitance. With reference to FIG. 2, it is generally preferable to keep the corner nodes 25, 26, 28 and 29, and also the intermediate nodes 91, 92, 95 of the high frequency sections as small as possible. The intermediate nodes 93, 94 of the low frequency sections can then be made larger to complete the connections on the board. At any rate, the stray capacitance measured from each corner of the bridge circuit should be preferably in the range of 1 to 1½ pf, and less than 5 pf at a maximum. These values of stray capacitance can generally be compensated for with the special transformer according to the present invention.

Figure 4:
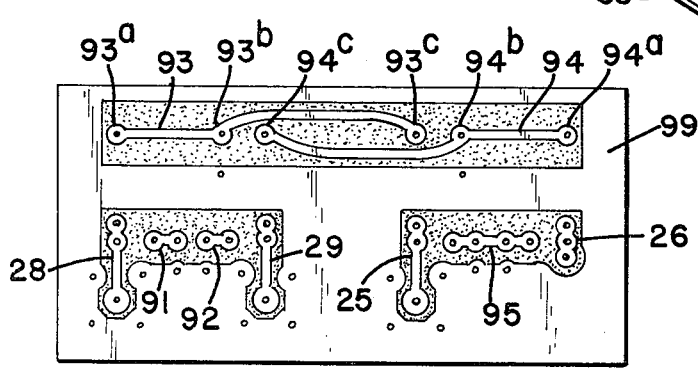
FIG. 4 is a drawing of a circuit board according to a preferred physical layout of the subject hybrid diplex-

FIG. 4 is a drawing of a circuit board layout for a hybrid diplexing filter according to the present invention, which is presently preferred. This circuit layout provides low stray capacitances which can be successfully compensated for by the impedance compensation transformer described above. Further, the layout shown in FIG. 4 can result in a hybrid diplexing filter having superior power isolation characteristics. The circuit board shown comprises a series of conductive tracks separated by insulative areas on a circuit board. The large conductive area labeled with reference number 99 is the ground track for the circuit. The other circuit nodes are numbered to correspond with the numbers given to nodes in the schematic diagram of FIG. 2, with the exception that the power passing port, rf isolation means, and power blocking means are not included in the circuit shown in FIG. 4. These items can easily be added to the basic layout as explained hereinafter.

Node 28 is the corner of the bridge circuit connecting to the common port, so it must be kept as physically small as possible. Node 28 has a pair of pads near its upper end which may be drilled to accept the ends of inductor 41 and capacitor 31 (of FIG. 2). In addition, at its lower end, node 28 has a larger pad which is adapted to receive a coaxial connector. This larger pad, together with the four holes indicated in the ground track therearound is suitable for mounting a low capacitance coaxial connector. Likewise, nodes 29 and 25 have coaxial connectors mounted thereon for receiving the high pass port and low pass port. In the alternative, rather than mounting coaxial connectors to the circuit board, lengths of coaxial line can be soldered directly to the respective nodes. In this case, the larger lower extension of nodes 28, 29 and 25 would not be required, but a third small pad could be added close to the upper two for each node. As yet another alternative, a larger circuit board may be used, and connections to the nodes 28, 29 and 25 could be made by way of stripline connections on the circuit board, each stripline having the characteristic impedance of the system.

In this manner connections could be made without increasing the stray capacitance at the nodes.

Referring to FIGS. 2 and 4, the high pass filter section 30 connects between nodes 28 and 29 as follows. The leads of capacitor 31 are inserted into holes drilled in the appropriate pads of nodes 28 and 91. Similarly, capacitor 32 connects between nodes 92 and 29. Transformer 33 is inserted in the two closest adjacent pads in nodes 91 and 92, and the two holes provided therebelow in the ground track 99. Thus, node 91 connects to the primary 34, node 92 connects to the secondary 35, and the other ends of both windings are grounded.

The low pass filter section 40 connects between nodes 28 and 25 as follows. Inductor 41 connects from the upper pad of node 28 to the pad 93a of node 93, straddling the intervening ground track area. In the preferred embodiment, components are mounted on the side of the circuit board opposite the conductive tracks, but this is not necessary. Capacitor 43 connects from pad 93b to the ground track just below pad 93b. Inductor 42 connects from pad 93c to the upper pad of node 25.

In similar manner, the low pass filter sections 60 connects between nodes 29 and 26 as follows. Inductor 61 connects from the upper pad of node 29 to pad 94c of node 94. Capacitor 63 connects from node 94b to the ground track immediately therebelow. Inductor 62 connects from pad 94a to the upper pad of node 26.

The remaining high pass filter section 50 connects between nodes 25 and 26 as follows. Capacitor 51 connects between the second pad of node 25 and the left-hand pad of node 95. Capacitor 52 connects between the right-hand pad of node 95 and the second pad of node 26. Inductor 53 connects from one of the remaining pads of node 95 to the ground track just below node 95. Node 26, which is the buried port, includes a third pad. Resistor 27 is connected between this pad and the ground track.

If line powering capability is to be included in the filter layout, the layout of FIG. 4 can be modified to provide the extra power blocking capacitor between node 25 and the low pass port. Additionally, a lead can be taken from node 25 to another circuit for the rf isolation means and the power passing port.

The presently preferred embodiment of the hybrid diplexing filter was constructed using the layout of FIG. 4, and components as follows. The filter was intended for application in an information transmission system having a band width from 5 MHz to 300 MHz, with a crossover frequency of 40 MHz. In addition, the low pass filter section 40 was designed to handle 10 amps continuous of low frequency AC power. The system was designed to work into a characteristic impedance of 75 ohms. Capacitors 31, 32, 51 and 52 are 33 pf, plus or minus 2%, 500 volt mica capacitors. Capacitors 43 and 63 are 100 pf plus or minus 2%, 500 volt capacitors of the same type. The capacitors are chosen for good frequency response, stability and small size. The 500 volt rating is required because of power line transients and lightening surges, which these filters experience under actual operating conditions.

Inductors 41, 42, 61 and 62 are .47 microhenry plus or minus 2% free-standing air core coils. They were constructed with 18 turns of 20 AWG Bisol (a trademark of Belden) insulator wire wound with a 0.191 inch inside diameter. For best results these coils should be machine wound, as very slight non-uniformities in winding can upset the symmetry and hence power isolation properties of the filter. Coil 53 is a 0.16 microhenry plus or minus 2% free-standing air core coil having a 0.206 inch inside diameter, with 8 turns of No. 20 AWG Bisol insulated wire. Resistor 27 is a 75 ohm plus or minus 5%, one-half watt non-inductive resistor.

Transformer 33 is wound on a 0.192 inch diameter coil form, using 32 AWG Bisol insulated wire. The primary and secondary wires are first twisted together to the extent of providing four twists per inch of length of the wire pair. The exact number of twists per unit length for a given layout must be determined experimentally, and is then repeatable thereafter. Generally, if capacitances are minimized as set forth above, compensation can be achieved with approximately four to six twists per inch. The twisted pair is then given four complete turns on the coil form.

It has been determined that the spacing between node 94 and the portion of the ground track it is closest to is critical for optimum performance. The zone of critical importance appears to be only that portion of node 94 between pads 94b and 94c, and specifically only that relatively straight portion of the node which is in closest proximity to the ground track. It is not fully understood why this spacing is critical, but it is believed to relate to some sort of stripline effect involving circulating currents along the ground track. In the example of the filter described above, a spacing of approximately 1/16 inch gave optimum results. In working with a new layout, some experimentation may be necessary, and this can be accomplished by using a piece of wire or foil along the ground track, and moving it back and forth in relation to the elongated node 94 while measurements are being made. Once optimum spacing is determined for a given layout, results are repeatable on a production basis.

Hybrid diplexing circuits built according to the present invention yield performance results far surpassing what has heretofore been possible with hybrid diplexing filters. The present invention provides input impedances which remain constant over the entire frequency band, including the critical high frequency portion. The circuit provides a return loss figure of close to −30 db. Finally, through careful control of the physical layout as set forth above, a power isolation of better than 50 db can be achieved.

What is claimed is:

1. In a hybrid diplexing filter which comprises a common port, a high pass port, a low pass port, first filter means connected between said common port and said high pass port for passing high frequency signals therebetween, second filter means connected between said common port and said low pass for passing signals therebetween having a frequency lower than signals passed by said first filter means, third filter means connected to said high pass port for passing low frequency signals, fourth filter means connected between said low pass port and said third filter means for passing high frequency signals, said first, second, third and fourth filter means thereby forming a bridge circuit, said common port of said hybrid diplexing filter inherently having stray capacitances associated therewith, the improvement which comprises a modified bifilar wound transformer included within said first filter means, said transformer having primary and secondary conductors twisted together to a predetermined degree to provide a predetermined amount of leakage inductance for compensating the hybrid diplexing filter for the effects of stray capacitances associated with said common port.

2. A hybrid diplexing filter for handling low frequency AC power, and higher and lower frequency rf signals, comprising:
 a. a common port;
 b. a high pass port;
 c. a low pass port;
 d. a power passing port;
 e. first filter means connected for coupling the higher frequency signals between said common port and said high pass port;
 f. second filter means connected for coupling the lower frequency signals between said common port and said low pass port said second filter means being adapted to carry low frequency power;
 g. third filter means for passing the lower frequency signals;
 h. fourth filter means for passing the higher frequency rf signals, said third and fourth filter means connected respectively to said first filter and said second filter means, and to each other, thereby completing an electrical bridge circuit;
 i. power blocking means connected to said low pass port, for isolating said low pass port from said low frequency AC power; and
 j. rf signal isolation means connecting said power passing port and said second filter means for providing low frequency AC power coupling between said power passing port and said common port, but for providing rf signal isolation for said power passing port.

3. A hybrid diplexing filter according to claim 2 wherein said rf signal isolation means is connected to the junction of said second and fourth filter means.

4. A hybrid diplexing filter according to claim 2 wherein said second filter means comprises a T-filter having an internal node, and wherein said rf signal isolation means is connected to said internal node.

5. A hybrid diplexing filter according to claim 3 wherein said power blocking means comprises a capacitor, and wherein said rf signal isolation means comprises an inductor connected between said power passing port and the junction of said second and fourth filter means, and a capacitor connected between said power passing port and signal ground.

6. A hybrid diplexing filter for handling a first band of high frequency signals, a second band of signals having a frequency lower than said first band, and low frequency AC power, comprising:
 a. a common port;
 b. a high pass port;
 c. a first high pass filter connecting said common port and said high pass port;
 d. a first low pass filter connected to said common port;
 e. a second low pass filter connected to said high pass port;
 f. a second high pass filter connected to said first and second low pass filters to complete an electrical bridge circuit;
 g. power blocking means connecting said low pass port to the junction of said first low pass filter and said second high pass filter;
 h. rf signal isolation means connecting said power passing port to said junction;
 i. said first high pass filter including a phase inversion transformer having a predetermined leakage inductance for compensating the hybrid diplexing filter for the effects of stray capacitances associated therewith.

7. A hybrid diplexing filter according to claim 6 wherein said transformer comprises a bifilar wound transformer in which the primary and secondary conductors are twisted together a predetermined amount to provide said predetermined leakage inductance.

8. A hybrid diplexing filter according to claim 7 wherein said first and second high and low pass filters comprise T-filters having crossover frequencies between said higher and lower band of rf frequencies.

9. A hybrid diplexing filter according to claim 6 further including a load resistor connected between signal ground and the junction of said second low pass filter and said second high pass filter, said load resistor having a resistance equal to the characteristic impedance of the system.

10. A hybrid diplexing filter, comprising:
 a. a common port;
 b. a high pass port;
 c. a low pass port;
 d. first filter means connected for passing high frequency signals between said common port and said high pass port;
 e. second filter means connected for passing low frequency signals between said common port and said low pass port;
 f. third filter means connected to said high pass port, said third filter means having frequency response characteristics similar to said second filter means;
 g. fourth filter means connected between said second filter means and said third filter means so as to complete an electrical bridge circuit, said fourth filter means having frequency response characteristics similar to said first filter means;
 h. said first filter means including a bifilar wound transformer having primary and secondary conductors twisted together to a predetermined extent to provide a predetermined amount of leaking inductance for compensating the hybrid diplexing filter for the effects of stray capacitances inherently associated with said common port.

11. A hybrid diplexing filter according to claim 10, further including a power passing port and rf isolation means for providing low frequency power coupling between said common port and said power passing port, and for providing isolation therebetween at frequencies higher than the power frequency, and power blocking means connected to said low pass port for providing isolation at the power frequency.

12. A hybrid diplexing filter, comprising:
 a circuit board having a plurality of conductive tracks which comprise the nodes of the filter circuit;
 said circuit board having a common node, a high pass node, a low pass node and a buried port node, at least portions of said nodes being in general alignment, the common node and the high pass node being adjacent each other, and the low pass node and the buried port node being adjacent each other; means defining a first high pass filter connected between said common node and said high pass node, said filter including a phase inversion transformer having a predetermined leakage inductance for compensating for stray capacitance;
 means defining a second high pass filter connected between said low pass node and said buried port node; means defining first and second low pass filters, each comprising a pair of inductors and a capacitor connected in a T-configuration at an internal node of the low pass filter;

said circuit board having a pair of elongated nodes adjacent each other and generally aligned with the aligned portions of said common, high pass, low pass, and buried port nodes but spaced apart therefrom, said elongated nodes comprising the internal nodes of said first and second low pass filters; the two inductors of said low-pass filters being connected from one of said elongated nodes to the common node, and to the low pass node, respectively;

the two inductors of said second low pass filter being connected from the other of said elongated nodes to the high pass node and the buried port node, respectively;

said circuit board having a conductive track defining a ground for the hybrid diplexing circuit, the ground track having a portion generally aligned with and positioned between said elongated tracks, on one side, and said common, high pass, low pass and buried port nodes on the other side;

said circuit board configured so that said portion of the grouund track, and the nearest of said elongated tracks are spaced apart a predetermined distance, so as to improve the power isolation characteristics of the hybrid diplexing circuit.

13. The method of compensating for the effects of stray capacitances associated with the common port of a hybrid diplexing filter of the type which includes a first filter connected between the common port and a high pass port for passing high frequency signals therebetween, said first filter including a transformer, a second filter connected between the common port and a low pass port for passing low frequency signals therebetween, a third filter having frequency response characteristics similar to said second filter and connected to the high pass port, and a fourth filter having frequency response characteristics similar to the first filter and connected to the low pass port and to the third filter thereby completing a bridge circuit, comprising the step of selecting the coupling coefficient of the transformer in the filter between the common and high pass ports for controlling the amount of leakage inductance of said transformer so as to compensate the hybrid diplexing filter for the effects of spray capacitances associated with the common port.

* * * * *